United States Patent
Farooq et al.

(10) Patent No.: US 7,472,836 B2
(45) Date of Patent: *Jan. 6, 2009

(54) METHOD AND STRUCTURE FOR IMPLEMENTING SECURE MULTICHIP MODULES FOR ENCRYPTION APPLICATIONS

(75) Inventors: Mukta G. Farooq, Hopewell Junction, NY (US); Benjamin V. Fasano, New Windsor, NY (US); Jason L. Frankel, Wappingers Falls, NY (US); Harvey C. Hamel, Poughkeepsie, NY (US); Suresh D. Kadakia, Poughkeepsie, NY (US); David C. Long, Wappingers Falls, NY (US); Frank L. Pompeo, Redding, CT (US); Sudipta K. Ray, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/768,312

(22) Filed: Jun. 26, 2007

(65) Prior Publication Data

US 2008/0000988 A1 Jan. 3, 2008

Related U.S. Application Data

(63) Continuation of application No. 10/907,761, filed on Apr. 14, 2005, now Pat. No. 7,281,667.

(51) Int. Cl.
*G06K 19/05* (2006.01)

(52) U.S. Cl. ...................... 235/492; 235/487

(58) Field of Classification Search .............. 235/492, 235/487, 494
See application file for complete search history.

(56) References Cited

U.S. PATENT DOCUMENTS

| 4,023,156 | A | 5/1977 | Galvin |
| 4,225,859 | A | 9/1980 | Zetting |
| 4,419,659 | A | 12/1983 | Harman |
| 4,538,527 | A | 9/1985 | Kitchen |

(Continued)

FOREIGN PATENT DOCUMENTS

EP 0035323 A1 2/1981

OTHER PUBLICATIONS

RF Kilburn; RF Olsen, "Printed Circuit Module Assembly" IBM Technical Disclosure Bulleting, Sep. 1982, 2p, vol. 25, No. 4, IBM Corp., Burlington, Vermont, USA.
KH Williams, "Complete Module Ceramic Circuitize Cap.", IBM Research Disclosure, Oct. 1987 1p, MA8860088, IBM Corp., Manassas, Virginia, USA.

*Primary Examiner*—Daniel St. Cyr
(74) *Attorney, Agent, or Firm*—Cantor Colburn LLP; Joseph Petrokaitis

(57) ABSTRACT

A tamper resistant, integrated circuit (IC) module includes a ceramic-based chip carrier, one or more integrated circuit chips attached to the chip carrier, and a cap structure attached to the chip carrier, covering the one or more integrated circuit chips. A conductive grid structure is formed in the chip carrier and cap structure, the conductive structure having a plurality of meandering lines disposed in an x-direction, a y-direction, and a z-direction. The conductive grid structure is configured so as to detect an attempt to penetrate the IC module.

5 Claims, 6 Drawing Sheets

U.S. PATENT DOCUMENTS

| | | |
|---|---|---|
| 4,777,476 A | 10/1988 | Dank |
| 4,884,061 A | 11/1989 | Genevois |
| 4,933,898 A | 6/1990 | Gilberg |
| 5,117,457 A | 5/1992 | Comerford |
| 5,285,734 A | 2/1994 | MacPherson |
| 5,309,387 A | 5/1994 | Mori |
| 5,369,299 A | 11/1994 | Byrne |
| 5,468,992 A | 11/1995 | Kanekawa |
| 5,506,566 A | 4/1996 | Oldfield |
| 5,517,057 A | 5/1996 | Beilstein |
| 5,614,761 A | 3/1997 | Kanekawa |
| 5,675,319 A | 10/1997 | Rivenberg |
| 5,705,981 A | 1/1998 | Goldman |
| 5,959,845 A | 9/1999 | Faucher |
| 5,963,927 A | 10/1999 | Herbert |
| 5,995,628 A | 11/1999 | Kitaj |
| 5,999,097 A | 12/1999 | Liddle |
| 6,121,069 A | 9/2000 | Boyko |
| 6,223,273 B1 | 4/2001 | Kanekawa |
| 6,396,400 B1 | 5/2002 | Epstein, III |
| 6,414,884 B1 | 7/2002 | DeFelice |
| 6,515,587 B2 | 2/2003 | Herbert |
| 6,545,371 B1 | 4/2003 | Matsumoto |
| 6,578,147 B1 | 6/2003 | Shanklin |
| 6,584,004 B2 | 6/2003 | Kanekawa |
| 6,642,448 B1 | 11/2003 | Loose |
| 6,657,314 B2 | 12/2003 | Pockrandt |
| 6,791,191 B2 | 9/2004 | Chow |
| 7,183,657 B2 | 2/2007 | Furtaw |
| 7,281,667 B2 * | 10/2007 | Farooq et al. ............... 235/492 |
| 2002/0020904 A1 | 2/2002 | Hikita |
| 2002/0149098 A1 | 10/2002 | Seyama |
| 2004/0021226 A1 | 2/2004 | Geffken |

* cited by examiner ated circuit

METHOD AND STRUCTURE FOR IMPLEMENTING SECURE MULTICHIP MODULES FOR ENCRYPTION APPLICATIONS

CROSS REFERENCE TO RELATED APPLICATIONS

This application is a continuation of U.S. application Ser. No. 10/907,761, filed Apr. 14, 2005, now U.S. Pat. No. 7,281,667, the contents of which are incorporated herein in their entirety.

BACKGROUND

The present invention relates generally to integrated circuit devices and packaging methods, and, more particularly, to a method and structure for implementing secure multichip modules (MCM) for encryption applications.

FIPS (Federal Information Processing Standard) 140-1 is a U.S. government standard for implementations of cryptographic modules; i.e., hardware or software that encrypts and decrypts data or performs other cryptographic operations (such as creating or verifying digital signatures). The FIPS 140-1 standard was created by the National Institute of Standards and Technology (NIST), and specifies requirements for the proper design and implementation of products that perform cryptography.

In particular, FIPS 140-1 specifies security requirements that are to be satisfied by a cryptographic module used within a security system protecting unclassified information within computer and telecommunication systems (including voice systems). The standard provides four increasing, qualitative levels of security (Level 1, Level 2, Level 3, and Level 4) which are intended to cover the wide range of potential applications and environments in which cryptographic modules may be employed. Each security level offers an increase in security over the preceding level. These four increasing levels of security allow for cost-effective solutions that are appropriate for different degrees of data sensitivity and different application environments.

For example, Security Level 1 provides the lowest level of security. It specifies basic security requirements for a cryptographic module, but does not mandate any physical security mechanisms in the module beyond the requirement for production-grade equipment. Examples of Level 1 systems include integrated circuit (IC) cards and add-on security products. Level 1 allows software cryptographic functions to be performed in a general purpose personal computer (PC).

Security Level 2 improves the physical security of a Security Level 1 cryptographic module by adding a requirement for tamper evident coatings or seals, or for pick-resistant locks. Tamper evident coatings or seals, which are available today, would be placed on a cryptographic module so that the coating or seal would have to be broken in order to attain physical access to the plaintext cryptographic keys and other critical security parameters within the module. Pick-resistant locks would be placed on covers or doors to protect against unauthorized physical access. In addition, Level 2 provides for role-based authentication in which a module must authenticate that an operator is authorized to assume a specific role and perform a corresponding set of services. It further allows software cryptography in multi-user timeshared systems when used in conjunction with trusted operating system.

Security Level 3 requires even further enhanced physical security measures, many of which are available in existing commercial security products. In contrast to Security Level 2 (which employs locks to protect against tampering with a cryptographic module, or employs coatings or seals to detect when tampering has occurred), Level 3 attempts to prevent an intruder from gaining access to critical security parameters held within the module. For example, a multi-chip embedded module must be contained in a strong enclosure, wherein if a cover is removed or a door is opened, the critical security parameters are zeroized (i.e., electronically erased by altering the contents thereof). Alternatively, a module may be enclosed in a hard, opaque potting material to deter access to the contents.

Among other aspects, Level 3 also provides for identity-based authentication, which is stronger than the role based-authentication used in Level 2. A module must authenticate the identity of an operator and verify that the identified operator is authorized to assume a specific role and perform a corresponding set of services.

Finally, Security Level 4 provides the highest level of security. Although most existing products do not meet this level of security, some products are commercially available which meet many of the Level 4 requirements. Level 4 physical security provides an envelope of protection around the cryptographic module. Whereas the tamper detection circuits of lower level modules may be bypassed, the intent of Level 4 protection is to detect a penetration of the device from any direction. For example, if an attempt is made to cut through the enclosure of the cryptographic module, then such an attempt should be detected and all critical security parameters should thereafter be zeroized. Level 4 devices are particularly useful for operation in a physically unprotected environment where an intruder could possibly tamper with the device.

Level 4 also protects a module against a compromise of its security due to environmental conditions or fluctuations outside of the module's normal operating ranges for voltage and temperature. Intentional excursions beyond the normal operating ranges could be used to thwart a module's defense during an attack. Thus, a module is required to either include special environmental protection features designed to detect fluctuations and zeroize critical security parameters, or to undergo rigorous environmental failure testing that provides a reasonable assurance that the module will not be affected by fluctuations outside of the normal operating range in a manner that can compromise the security of the module.

Unfortunately, existing multichip modules (MCM's) conforming to Level 4 security requirements implement difficult and cumbersome designs that involve, for example, potting a fragile mesh card structure. Moreover, such designs provide a limited capacity for desired electromagnetic (EM) shielding. Still a further difficulty stems from changing existing crypto modules from an organic based material to a ceramic based material, in that ceramic materials present certain interconnect problems such as nearest neighbor shorting in the ball grid array due to the collapse of solder balls. In addition, a fully collapsing structure will have a low interconnect height that in turn can cause a larger percentage variation between interconnect heights across the device. A collapsed height of the final interconnection may also cause shorts or opens.

Accordingly, it would be desirable to implement secure multichip modules (MCM) for encryption applications in a manner that overcomes such disadvantages.

SUMMARY

The foregoing discussed drawbacks and deficiencies of the prior art are overcome or alleviated by a tamper resistant, integrated circuit (IC) module. In an exemplary embodiment, the IC module includes a ceramic-based chip carrier, one or more integrated circuit chips attached to the chip carrier, and a cap structure attached to the chip carrier, covering the one or more integrated circuit chips. A conductive grid structure is formed in the chip carrier and cap structure, the conductive structure having a plurality of meandering lines disposed in an x-direction, a y-direction, and a z-direction. The conductive grid structure is configured so as to detect an attempt to penetrate the IC module.

In another embodiment, a secure cap structure for an integrated circuit (IC) module includes a metallized, ceramic top portion, and a footing integrated with the top portion. The footing is configured to be attached to a chip carrier of the IC module in a manner so as to surround one or more IC chips attached to the chip carrier when the cap structure is attached to the chip carrier.

In still another embodiment, a tamper resistant, integrated circuit (IC) module includes a ceramic-based chip carrier, one or more integrated circuit chips attached to the chip carrier, and a ceramic-based cap structure attached to the chip carrier. The cap structure includes a top portion and a footing integrated thereon, the footing surrounding the one or more IC chips attached to the chip carrier. A conductive grid structure is formed in the chip carrier and cap structure, the conductive grid structure having a plurality of meandering lines disposed in an x-direction, a y-direction, and a z-direction, wherein the conductive grid structure is configured so as to detect an attempt to penetrate the IC module.

In still another embodiment, a method for implementing a tamper resistant, integrated circuit (IC) module is disclosed, the IC module including a ceramic-based chip carrier, one or more integrated circuit chips attached to the chip carrier, and a ceramic-based cap structure attached to the chip carrier. The method includes forming a conductive grid structure within the chip carrier and the structure, the conductive grid structure having a plurality of meandering lines disposed in an x-direction, a y-direction, and a z-direction. The conductive grid structure is configured to determine an attempt to penetrate the IC module by detecting at least one of a change in resistance and a change in capacitance or inductance of the conductive grid structure.

BRIEF DESCRIPTION OF THE DRAWINGS

Referring to the exemplary drawings wherein like elements are numbered alike in the several Figures:

FIG. 4(*b*) illustrates a section of meander lines formed at an exemplary width of about 50 microns (μm), and an exemplary pitch of about 150 μm;

DETAILED DESCRIPTION

Disclosed herein is a method and structure for implementing secure multichip modules (MCM) for encryption applications that conforms to, for example, Security Level 4 of the FIPS 140-1 standard. Briefly stated, a ceramic-based chip security module assembly has a chip carrier to which one or more integrated circuit chips are attached, in addition to a cap for protecting and sealing access to the IC chips. Both the ceramic chip carrier and cap are provided with a protective grid of conductive, meandering security lines formed therein, in the x, y and z directions. The security lines, in addition to providing intrusion detection (through monitoring means such as dielectric impedance shifting and resistive shift detection) are also configured so as to provide electromagnetic shielding.

Figure 1:
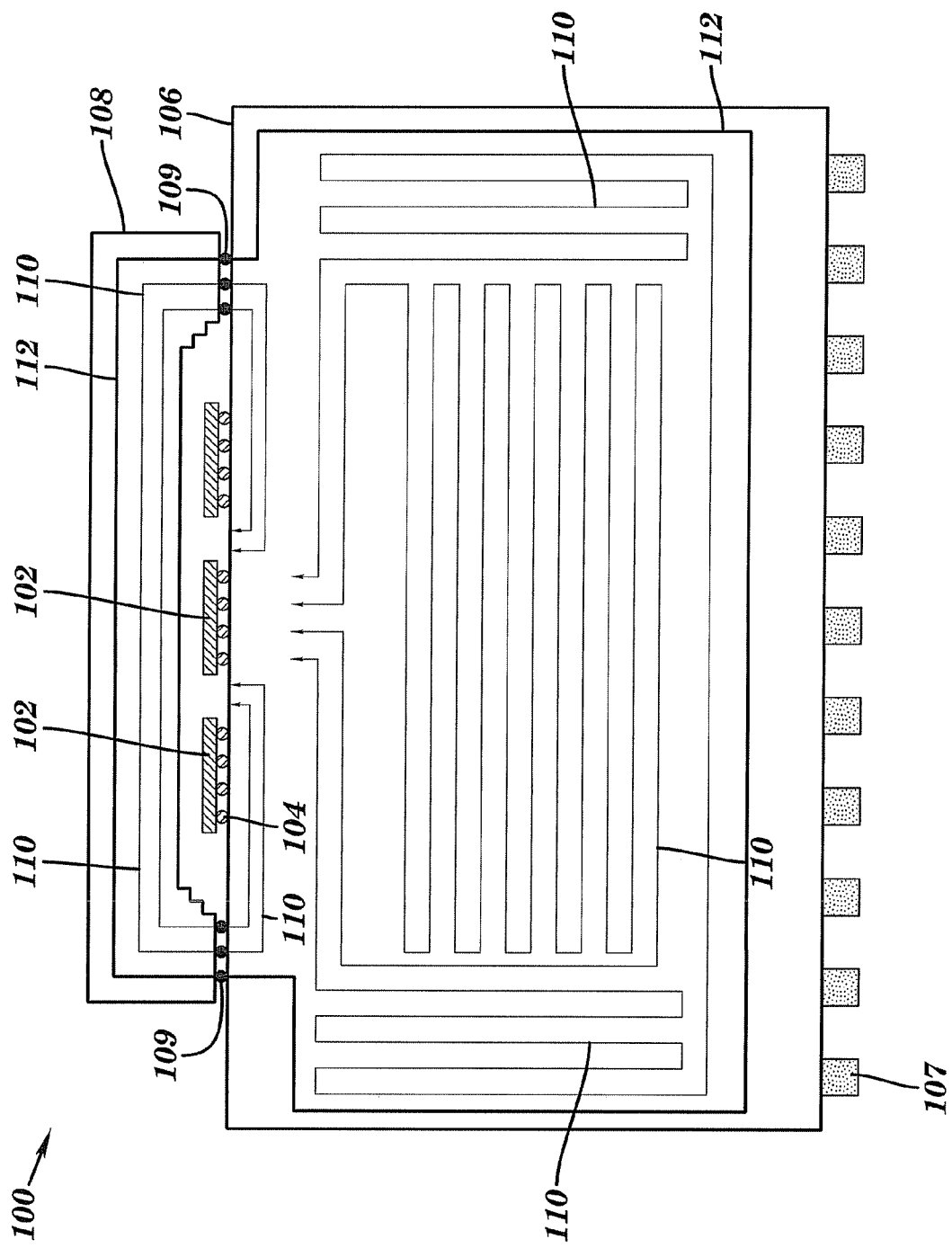
FIG. 1 is a schematic, cross-sectional view of an MCM security module configured in accordance with an embodiment of the invention.

Referring initially to FIG. 1, there is shown a schematic, cross-sectional view of an MCM (or SCM) security module 100 configured in accordance with an embodiment of the invention. A plurality of integrated circuit chips 102 (e.g., processors, memory, embedded memory) are provided with a number of solder balls 104 affixed thereto for mechanical and electrical attachment to a chip carrier 106. The chip carrier 106 also features board module interconnections (I/Os) 107, which may be of a ball grid array (BGA) type, a column grid array (CGA) type, or a land grid array (LGA) type, for example. The IC chips 102 and/or solder balls 104 may be encapsulated or underfilled with a sealing material (e.g., epoxy) to reduce stress on the solder balls 104 due to thermal expansion mismatch between the chip and chip carrier materials. It will also be appreciated that the chip carrier 106 may have other components affixed thereto, such as capacitors, resistors and similar discrete devices (not shown).

A cap section 108 is also provided to securely enclose the IC chips 102 attached to the chip carrier 106. In the embodiment depicted, both the chip carrier 106 and the cap section 108 may be, for example, multi-layer ceramic or laminate/organic structures. Each section is fabricated so as to permit access to internal wiring at the interface therebetween. This allows an enclosing electrical network to surround the resulting chip-containing internal cavity when the cap section 108 is attached to chip carrier 106, such as through the use of conductive, adhesive interconnections 109 (e.g., solder balls) As shown, the network features both a tamper detection structure (e.g., a conductive grid) and an electromagnetic (EM) shielding structure.

More specifically, the tamper detection structure includes a plurality of security meander lines 110 embedded within the chip carrier 106 and the cap section 108. The meander lines 110 are configured to run in both an x-y direction and a vertical (z) direction such that upon intrusion into the structure from any direction, a change in resistance and/or impedance of the lines is detected. Also illustrated in FIG. 1 is an electromagnetic interference (EMI) shield 112 that surrounds the meander lines 110 and ICs, 102 and extends into both the chip carrier 106 and the cap structure 108. The EMI shield 112 is constructed in a similar manner as the security meander lines 110, but forms a completely closed path to contain the radiated energy from the ICs 102.

Figure 2:
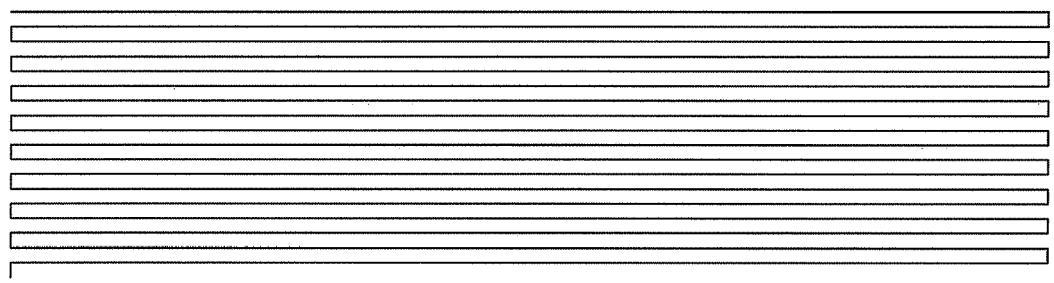
FIG. 2 depicts an exemplary x-y layout of the meander lines included in a ceramic chip carrier and/or cap structure for the security module of FIG. 1.
Figure 3:
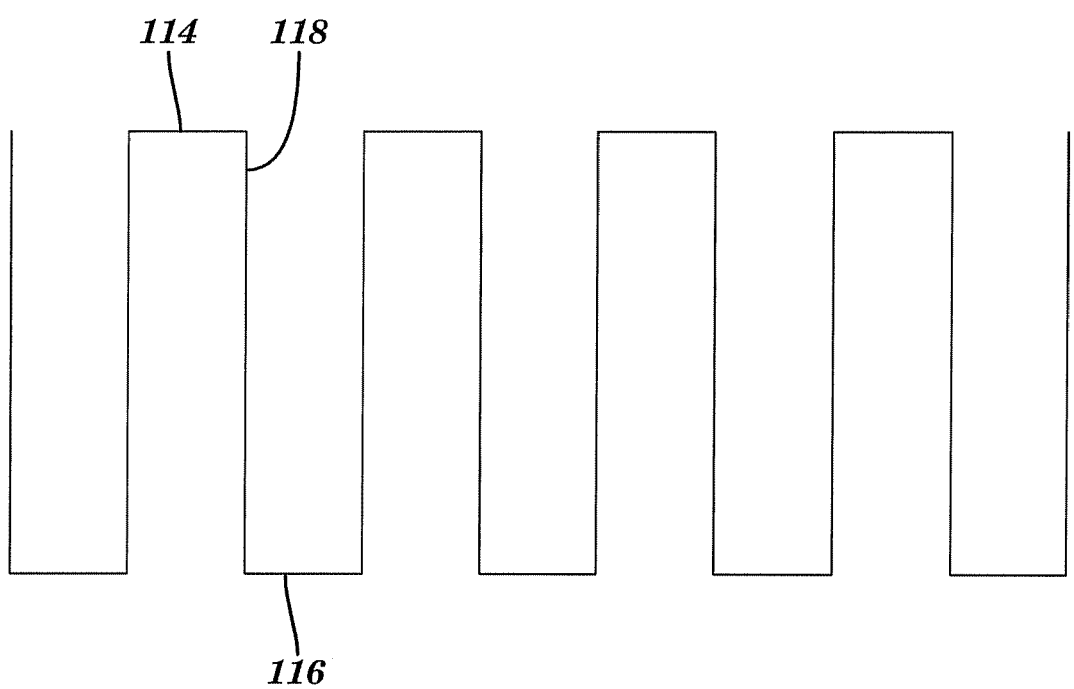
FIG. 3 illustrates an exemplary vertical meander line for the security module of FIG. 1.

FIGS. 2 and 3 more specifically illustrate the configuration and tamper detection properties of the meander lines 110. In FIG. 2, the x-y layout of the meander lines are shown for an exemplary layer of either the ceramic chip carrier 106 or cap structure 108, while FIG. 3 illustrates an exemplary vertical meander line in which jogs 114 from one level are connected to jogs 116 in another level through conductively filled vias 118.

Figure 4A:
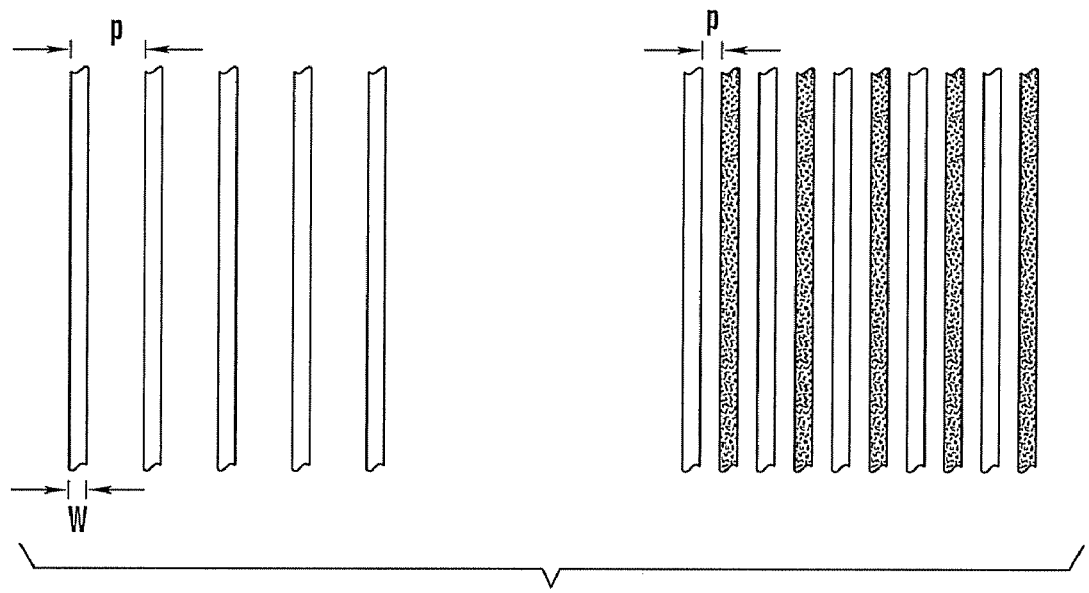
FIG. 4(*a*) illustrates a section of meander lines formed at an exemplary width of about 50 microns (μm), and an exemplary pitch of about 200 μm.
Figure 4B:
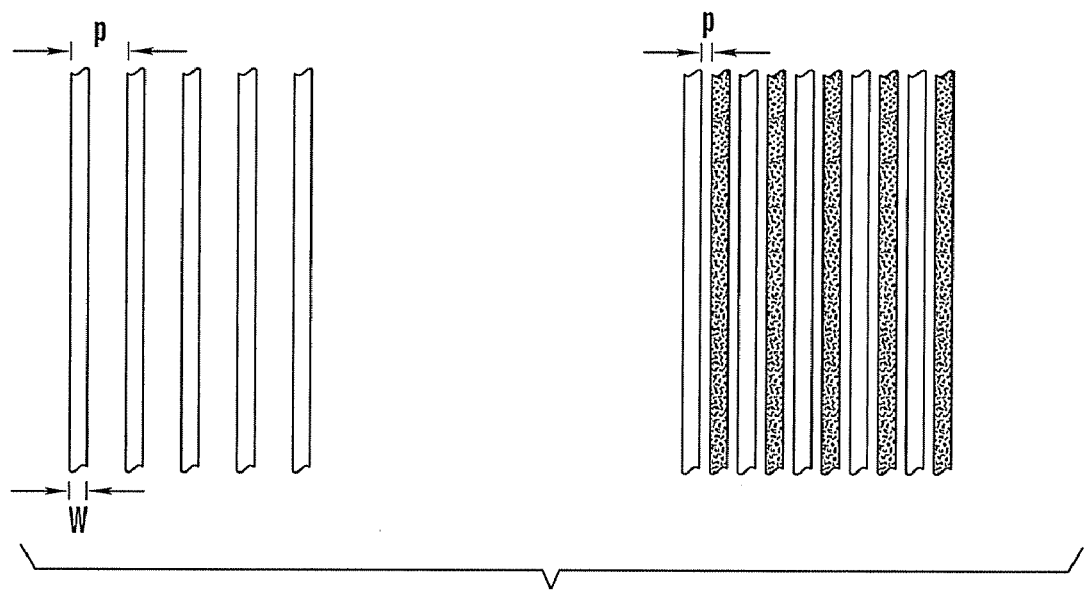
Figure 5:
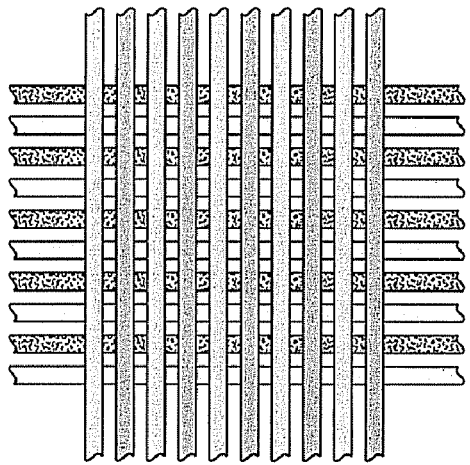
FIG. 5 illustrates the relationship between meander lines on four adjacent wiring levels, with a first offset pair running in an x-direction and a second offset pair running in a y-direction.

The spacing between the individual meander lines 110 on a level is arranged so as to facilitate reliable throughput on a given level, but at the same time providing protection against mechanical intrusion from a probing attempt. For example, FIG. 4(a) illustrates a section of parallel meander lines 110 formed at an exemplary width, w, of about 50 microns (μm), and an exemplary pitch, p, of about 200 μm. By offsetting the meander lines on an adjacent level (i.e., creating an interdigitated arrangement), an effective 50 μm pitch is created in the z-direction. In FIG. 4(b), the 50 μm wide lines are formed at a pitch of about 150 μm, and thus the interdigitated lines at an adjacent level create an even tighter effective pitch to detect an intruding object. Moreover, this effective pitch becomes even tighter where the linewidth exceeds the nominal thickness. FIG. 5 illustrates the relationship between meander lines on four adjacent wiring levels, with a first offset pair running in an x-direction and a second offset pair running in a y-direction.

Figure 6:
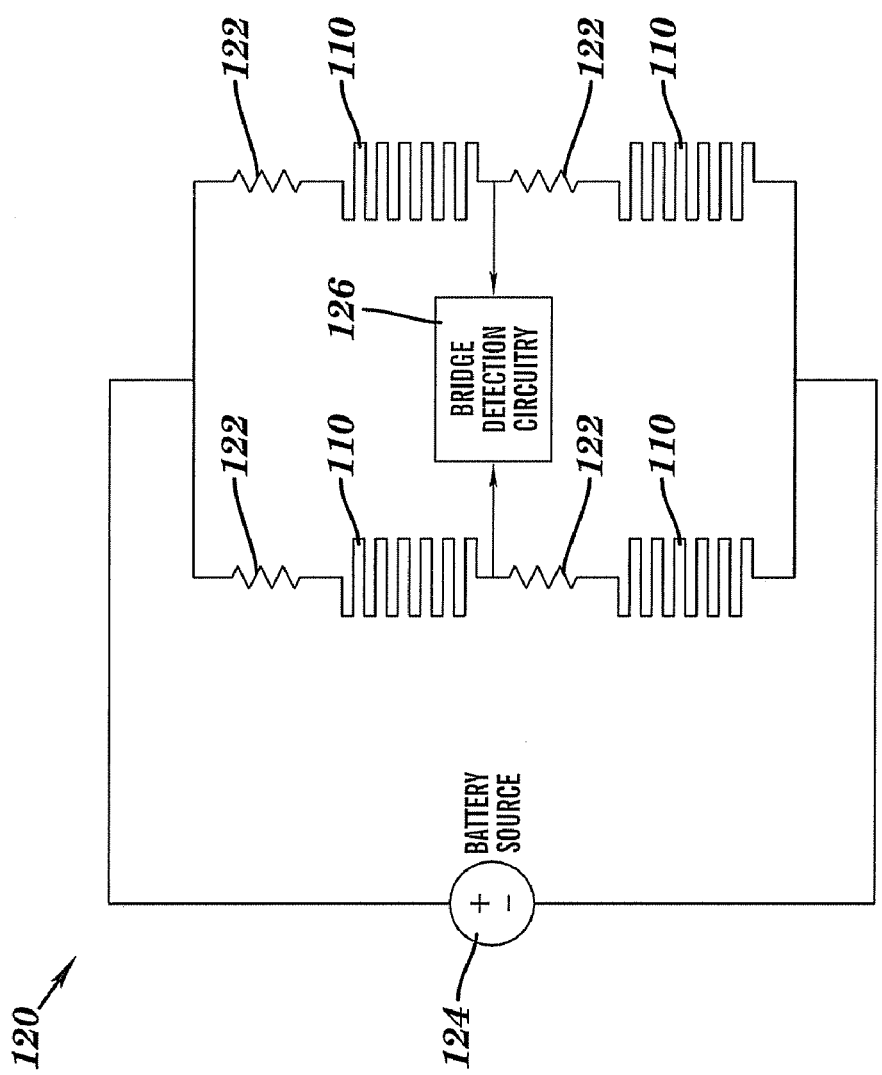
FIG. 6 is a schematic diagram of an exemplary bridge structure that may be configured in order to detect an open or short circuit condition between any combination of meander lines.

Referring now to FIG. 6, there is shown an exemplary bridge structure 120 that may be configured in order to detect an open or short circuit condition between any combination of meander lines 110. Since the meander lines 110 are likely to have resistances on the order of tens of ohms, a corresponding series of discrete resistors 122 is used with each meander line. This maintains the circuit impedance level at a high enough value so as to prevent excessive current from prematurely discharging the supply battery 124. The resistors 122 may be implemented through placement of discrete components or, alternatively, they may be integrated as part of the wiring patterning of the ceramic layers themselves. Connection points across opposing sides of the bridge structure 120 are made to the bridge detection circuitry 126, which in turn may be formed on a separate chip attached to the chip carrier 106 or implemented as a macro on one of the existing chips (e.g., flash memory, static memory, processor).

One potential shortcoming, however, in using resistors 122 in the DC bridge structure 120 of FIG. 6 is the susceptibility of the circuit to rigging a bypass jumper connection across one or more of the meander lines 110 so as to suppress detection of a breach in the bypassed line. Since a change in resistance of a shorted meander line is on the order of about 1Ω or less, this change is effectively swamped out by the value of the corresponding series resistor 122. In other words, the bridge detection circuitry 126 may not have sufficient sensitivity to detect a relatively small DC resistance change in one leg of a relatively high resistance bridge circuit. Accordingly, an alternative tamper detection scheme may employ the use of AC (e.g., sine wave) or other time varying signals to the detection circuitry such that additional parameters like phase changes can be detected. Again, it is still desired to implement such a scheme in a manner that consumes relatively little power.

Figure 7:
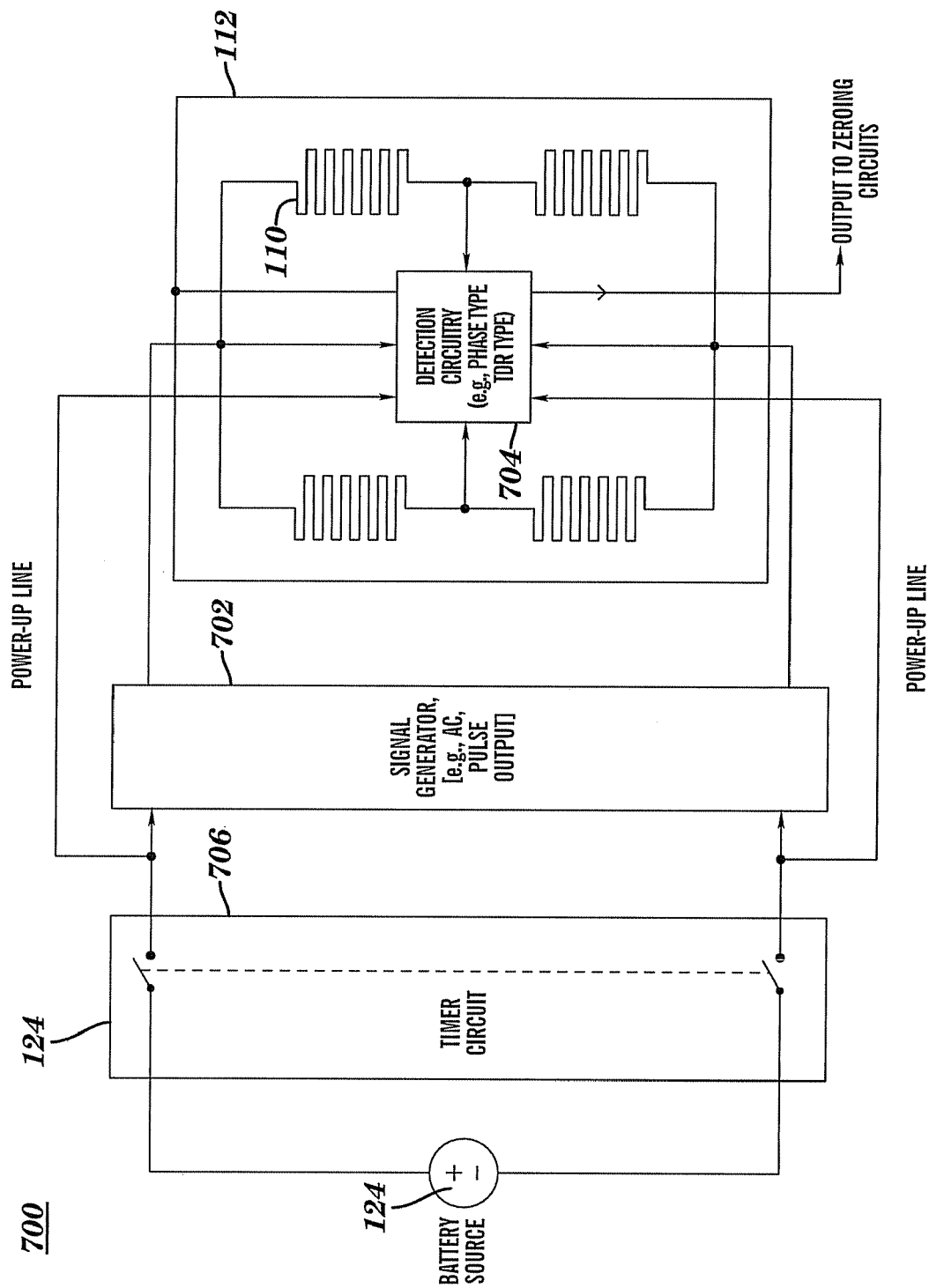
FIG. 7 is a schematic diagram of an enhanced detection circuit with respect to FIG. 6, in accordance with a further embodiment of the invention.

Accordingly, FIG. 7 is a schematic diagram of an enhanced detection scheme 700 with respect to FIG. 6, in accordance with a further embodiment of the invention. As is shown, a signal generator 702 is configured to provide a time varying signal, such as AC or a pulsed output, for example, to detection circuitry 704 that is both amplitude and phase sensitive. Rather than using resistors, a timer circuit 706 intermittently couples the battery source 124 to the signal generator 702, as well as to detection circuitry 704 for conserving power. By powering the signal generator 702 at a low duty cycle to conserve battery power, the detector scheme 700 can incorporate both amplitude and phase sensitive circuitry 704 that is also powered up through the same duty cycle as the drive circuitry (i.e., signal generator 702). The amplitude and phase sensitive detection circuitry 704 may detect changes in parameters such as, for example, resistance, inductance and capacitance of the meander lines 110 caused by intrusion with probes, attempted jumping and cutting of lines, dissolving liquids, and other types of intrusion methods.

The availability of high levels of circuit integration, digital signal processing and mixed signal techniques thus permits a refined detection methodology. Possible techniques in this regard may include, for example, TDR (Time Domain Reflectometry) and TDT (Time Domain Transmission). Such methods would use differences in pulse shape and arrival times by comparing an ongoing response signal to an initialized standard (which may be unique to each substrate, for example). Moreover, combinations of time domain and frequency methods that examine phase at various frequencies could be used provided they are implemented within a desired power budget. Such multiple, simultaneous methods of thwarting tampering attempts of the protective structure can significantly enhance the security.

Figure 8:
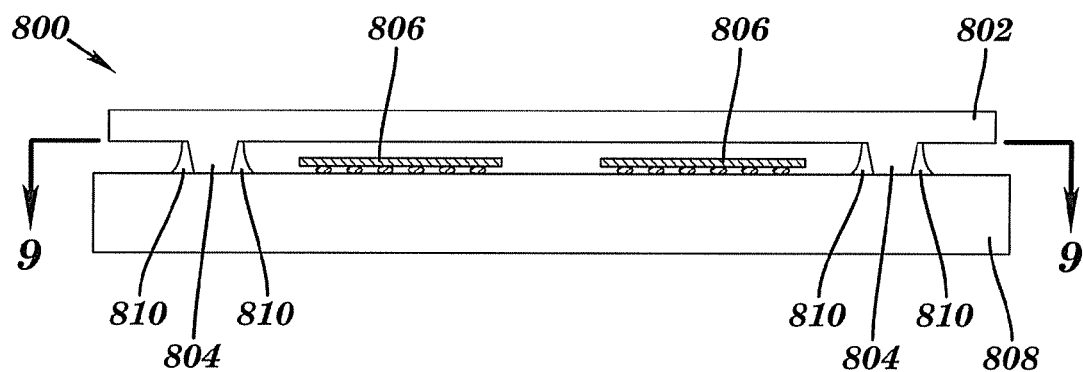
FIG. 8 is a cross sectional view of a metallized ceramic cap structure, in accordance with a further embodiment of the invention.
Figure 9:
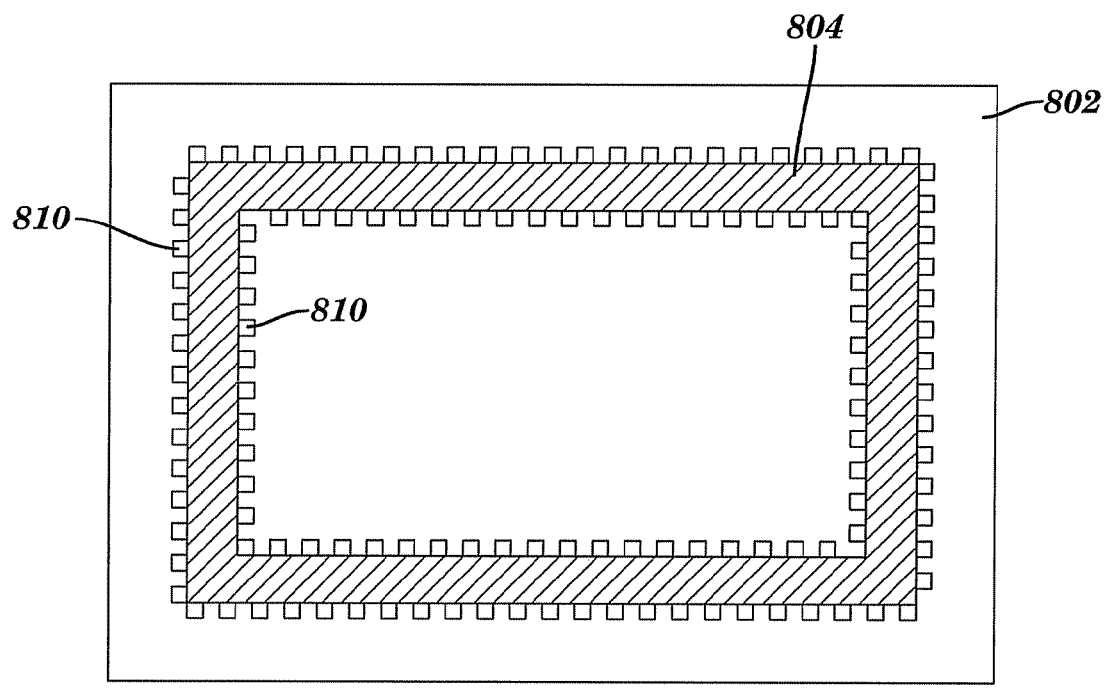
FIG. 9 is a top down cross-sectional view of the metallized cap structure, taken along the lines 9-9 of FIG. 8.

Finally, FIGS. 8 and 9 illustrate a metallized ceramic cap structure 800, in accordance with a further embodiment of the invention. In lieu of using soldered surface connection to the chip carrier, the cap structure features an integral standoff (or footing) having an inner and an outer perimeter of solder fillets attached thereto that eliminate the need for solder ball mounting to the carrier. In addition to eliminating problems of nearest neighbor shorting of solder connects, the present configuration also prevents solder splash between cap-to-carrier interconnect and adjoining components.

As particularly shown in the cross-sectional view of FIG. 8, the cap structure 800 includes a top portion 802 integrated with a footing 804 that surrounds and protects the individual chips 806 (e.g., processors, memory, embedded memory) attached to the carrier 808. The cap structure 800 may be formed from a material such as alumina, for example, and may further include other ceramic compositions such as glass phase additions to match the coefficient of thermal expansion (CTE) of the ceramic chip carrier 808. The cap structure 800 further contains internal metallization, which may include materials such as (for example) Mo, W, Ti, Ni, Cu, and Au. A surface metallization may also be included on the cap structure 800.

In order to provide tamper-proof, Level 4 security for all components mounted on the ceramic carrier 808, the cap structure 800 must be able to withstand penetration attempts by any of a number of methods such as, for example, mechanical probing, drilling, and directed lasers. Both the top portion 802 of the cap structure 800 and chip carrier 808 include internal wiring configured into fine grid patterns; thus, if these wiring "nets" are breached and the subsequent change in resistance or impedance is detected by a circuit monitoring device, the module will automatically power down to prevent access to critical data. On the other hand, with respect to penetration through the perimeter footing 804, a plurality of solder fillets 810 disposed around the exterior (and interior) of the footing 804 accomplishes at least two functions. First, the fillets 810 provide a permanent solder attachment between the cap structure 800, chip carrier 808, and the series of discrete or continuous metallized lines patterned therein. Second, the fillets 810 also provide a security function by the specific placement thereof.

More specifically, FIG. 9 illustrates a top down cross-sectional view of the cap structure 800, taken along the lines 9-9 of FIG. 8. Again, electrical continuity between the cap structure 800 and the chip carrier 808 is achieved through the solder fillets 810, which may be formed around either side of the perimeter footing 804. Complete contact between the metallized ceramic cap structure 800 and the chip carrier 808 is further facilitated through the use of a polymeric adhesive layer placed between the footing 804 and the chip carrier 808. The thickness of the adhesive layer is intentionally kept thin and is not electrically conductive.

The solder fillets 810 are further defined by selectively metallizing vertical surfaces of the footing 804 so as to limit solder wetting and spreading. Separation between adjacent solder fillets is preferably kept to a minimum so as to prevent penetration by a probe between two adjacent solder fillets. Moreover, the width of each individual solder fillet 810 should be kept to a minimum so that any penetration of a solder fillet by a probe will be readily detected as a change in resistance or impedance of the electrical circuit. In the embodiment depicted, the arrangement of the solder fillets 810 along the inner and outer perimeter of the footing 804 is such that the each fillet on the inner perimeter is located between a pair of fillets on the outer perimeter, and vice versa. In other words, the fillets along one side of the footing 804 are positioned interstitially with respect to the fillets on the opposite side. Thus, if a probe or some other instruments were to be inserted between fillets on the outer perimeter and through the footing material), then the instrument would further come into contact with a fillet on the inner perimeter.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a tamper resistant, integrated circuit (IC) module, the method comprising:

embedding a conductive grid structure within both a ceramic-based chip carrier and a ceramic based cap structure, said conductive grid structure having a plurality of meandering lines disposed in an x-direction, a y-direction, and a z-direction;

attaching one or more integrated circuit chips to a top surface chip carrier; and attaching the cap structure to the top surface of the chip carrier;

wherein said conductive grid structure is configured to determine an attempt to penetrate the IC module by detecting at least one of a change in resistance and a change in capacitance of said conductive grid structure.

2. The method of claim 1, further comprising adhering the cap structure to the chip carrier with a polymeric adhesive layer between a footing of the cap structure and the chip carrier, wherein said footing surrounds the one or more IC chips attached to the chip carrier.

3. The method of claim 1, further comprising:

forming a plurality of solder fillets along an outer perimeter and an inner perimeter of said footing, said solder fillets configured to provide electrical connection between internal wiring of the cap structure and internal wiring of the chip carrier;

wherein said plurality of solder fillets on said outer perimeter and said plurality of solder fillets on said inner perimeter are positioned interstitially with respect to one another.

4. The method of claim 1, wherein meandering lines formed on one wiring level of said chip carrier are disposed in an offset arrangement with respect to meandering lines formed on an adjacent wiring level of said chip carrier, and wherein said plurality of meandering lines in said x-direction and said y-direction are formed at a selected linewidth and pitch therebetween, such that said offset arrangement results in an effective pitch in said z-direction equal to or less than said selected linewidth.

5. The method of claim 1, wherein said meandering lines in said z-direction further comprise jogs formed on one level of said chip carrier coupled to jogs formed on another level of said chip carrier through conductively filled vias.

* * * * *